US008815123B2

(12) United States Patent
Huang et al.

(10) Patent No.: US 8,815,123 B2
(45) Date of Patent: Aug. 26, 2014

(54) FABRICATION METHOD FOR IBIIIAVIA-GROUP AMORPHOUS COMPOUND AND IBIIIAVIA-GROUP AMORPHOUS PRECURSOR FOR THIN-FILM SOLAR CELLS

(75) Inventors: Yu Huang, Hsinchu (TW); Chiou Yen Chiou, Tainan (TW); Bing Joe Hwang, Taipei (TW); Hsuan-Fu Wang, Taipei (TW); Shih-Hong Chang, Dali (TW); Chih-Lung Lin, Chiayi County (TW); Chih-Chung Wu, Taichung (TW)

(73) Assignee: Industrial Technology Research Institute, Hsinchu County (TW)

( * ) Notice: Subject to any disclaimer, the term of this patent is extended or adjusted under 35 U.S.C. 154(b) by 962 days.

(21) Appl. No.: 12/418,591

(22) Filed: Apr. 4, 2009

(65) Prior Publication Data

US 2010/0133479 A1 Jun. 3, 2010

(30) Foreign Application Priority Data

Dec. 3, 2008 (TW) ............................... 97146883 A

(51) Int. Cl.
| | |
|---|---|
| *H01B 1/00* | (2006.01) |
| *H01B 1/12* | (2006.01) |
| *B05D 5/12* | (2006.01) |
| *C08F 2/46* | (2006.01) |
| *C08J 7/18* | (2006.01) |
| *B21D 53/06* | (2006.01) |
| *B21K 21/00* | (2006.01) |
| *B23P 15/26* | (2006.01) |
| *C23C 16/00* | (2006.01) |
| *H01L 21/02* | (2006.01) |
| *C01B 19/00* | (2006.01) |
| *H01L 31/032* | (2006.01) |
| *H01B 1/02* | (2006.01) |

(52) U.S. Cl.
CPC ........... *C01B 19/002* (2013.01); *C01P 2004/52* (2013.01); *H01L 21/0259* (2013.01); *C01B 19/008* (2013.01); *C01P 2002/72* (2013.01); *H01L 31/0322* (2013.01); *H01B 1/026* (2013.01); *C01P 2002/30* (2013.01); *H01L 21/02568* (2013.01); *H01L 21/02628* (2013.01); *H01L 21/02565* (2013.01); *Y02E 10/541* (2013.01); *C01P 2002/85* (2013.01); *C01P 2004/03* (2013.01); *C01B 19/007* (2013.01)
USPC ........ 252/500; 427/74; 427/126.1; 427/407.1; 427/487; 427/585; 427/255.11; 29/890.033

(58) Field of Classification Search
CPC ............ C01P 2002/30; C01P 2002/72; C01P 2002/85; C01P 2004/03; C01P 2004/52; C01B 1/026; C01B 19/002; C01B 19/008; C01B 19/017; H01L 21/0259; H01L 21/02565; H01L 21/02568; H01L 21/02628; H01L 31/0322; Y02E 10/541
USPC ........ 427/74, 126.1, 407.1, 487, 585, 255.11; 29/890.33; 252/500
See application file for complete search history.

(56) References Cited

U.S. PATENT DOCUMENTS 5,674,325 A * 10/1997 Albright et al. ............... 136/250
6,126,740 A    10/2000 Schulz et al.
(Continued)

FOREIGN PATENT DOCUMENTS

WO    WO03081683 A1 * 10/2003 .......... H01L 31/0352

OTHER PUBLICATIONS

Schulz et al. Journal of Electronic Materials vol. 27 No. 5 1998 pp. 433-437.*

(Continued)

*Primary Examiner* — Patrick Ryan
*Assistant Examiner* — Aaron Greso
(74) *Attorney, Agent, or Firm* — Pai Patent & Trademark Law Firm; Chao-Chang David Pai

(57) ABSTRACT

A method for fabricating an IBIIIAVIA-group amorphous compound used for thin-film solar cells is provided. A mixture solution including elements of Group IB, IIIA, VIA or combinations thereof is provided. The mixture solution is heated and filtered. IBIIIAVIA-group amorphous powders are acquired after drying the heated and filtered mixture solution.

14 Claims, 13 Drawing Sheets

(56) References Cited

U.S. PATENT DOCUMENTS

| | | | |
|---|---|---|---|
| 6,193,936 B1* | 2/2001 | Gardner et al. | 422/186 |
| 6,788,866 B2* | 9/2004 | Bryan | 385/129 |
| 6,849,334 B2* | 2/2005 | Horne et al. | 428/402 |
| 6,952,504 B2* | 10/2005 | Bi et al. | 385/9 |
| 7,026,258 B2 | 4/2006 | Taunier et al. | |
| 2003/0228415 A1* | 12/2003 | Bi et al. | 427/180 |
| 2007/0186971 A1 | 8/2007 | Lochun et al. | |
| 2007/0212510 A1* | 9/2007 | Hieslmair et al. | 428/40.1 |

OTHER PUBLICATIONS

Schulz et al, "Cu—In—Ga—Se Nanoparticle Colloids as Spray Deposition Precursors for Cu(In,Ga)Se2 Solar Cell Materials", Journal of Electronic Materials, vol. 27, No. 5, 1998.

Terauchi et al, "Preparation of CuInSe2 thin films by selenization of Cu—In—O precursors", Solar Energy Materials and Solar Cells, 35, 121-127, 1994.

Repins et al, "19.9%-efficient ZnO/CdS/CuInGaSe2 Solar Cell with 81.2% Fill Factor", Prog. Photovolt: Res. Appl. 2008; 16:235-239.

Staebler et al, "Reversible conductivity changes in discharge-produced amorphous Si", Appl. Phys. Lett., vol. 31, No. 4, 292, 1977.

Cui et al., "Fabrication and characterization of CuInS2 films by chemical bath deposition in acid conditions", J Mater Sci: Mater Electron (2009) 20, 609-613, Jul. 21, 2008.

First examination opinion notification issued by the Taiwan Intellectual Property Office on Jun. 27, 2012, for the above-referenced application's counterpart application in Taiwan (Application No. 097146883 filed Dec. 3, 2008).

Valderrama et al., "Photoelectrochemical Characterization of CIGS Thin Films for Hydrogen Production", Solar Energy Materials & Solar Cells 88, (2005), 145-155.

\* cited by examiner

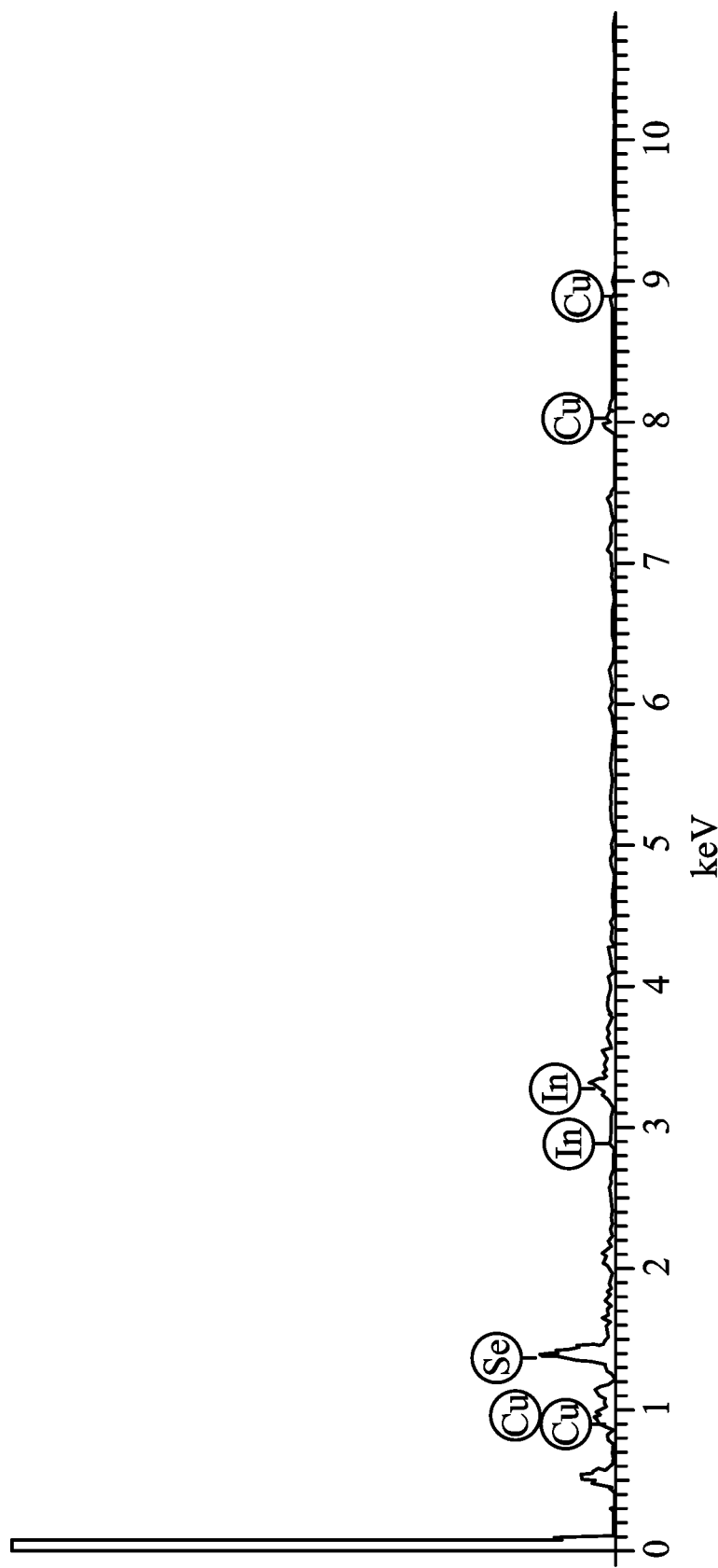

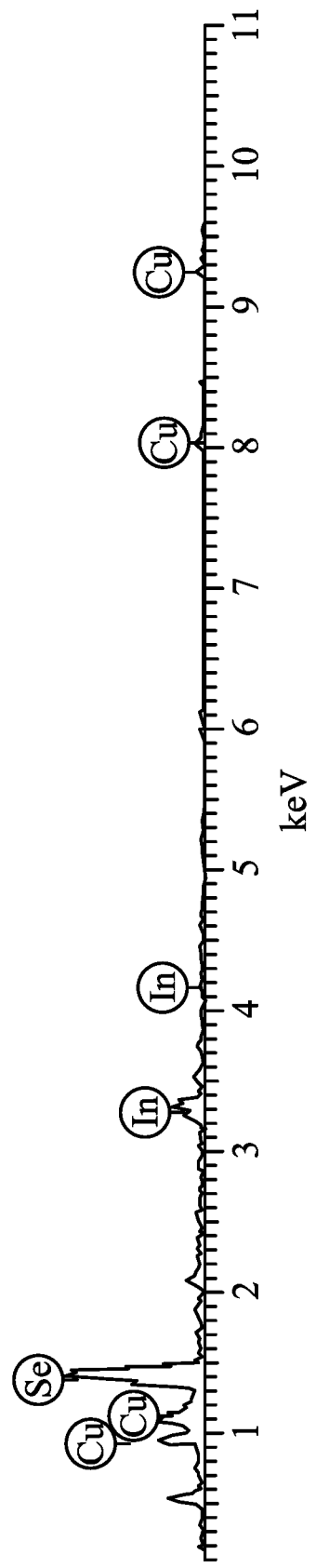

FABRICATION METHOD FOR IBIIIAVIA-GROUP AMORPHOUS COMPOUND AND IBIIIAVIA-GROUP AMORPHOUS PRECURSOR FOR THIN-FILM SOLAR CELLS

CROSS REFERENCE TO RELATED APPLICATIONS

This Application claims priority of Taiwan Patent Application No. 97146883, filed on Dec. 3, 2008, the entirety of which is incorporated by reference herein.

BACKGROUND OF THE INVENTION

1. Field of the Invention

The invention relates to methods for fabricating an IBIIIAVIA-group amorphous compound, and more particularly to methods for fabricating an IBIIIAVIA-group amorphous precursor used for a thin-film solar cell.

2. Description of the Related Art

Thin film solar cells have already been researched and developed, as countries search for available and clean energy. For electric power, power generator systems mainly comprise thermal power, waterpower, and nuclear power generators. However, the thermal power generator uses fossil fuels that cause environmental pollution problems such as air pollution, acid rain, greenhouse effect, etc. In addition, fossil fuels have limited supply. for waterpower, waterpower generators are not very practicable due to geographic limitations. For nuclear power generation, nuclear waste generated therefrom, seriously and negatively impacts the environment. Therefore, an energy source, which is not a pollutant and is highly practicable and unfailingly available, is desired. At present, the most potential energy power is solar power energy as it is inexhaustible, safe for the environment, and not limited to geography. In other words, solar power energy is a clean and practicable regenerated power source.

For thin film solar cell research, a major objective is to manufacture a device with a low cost and a simple manufacturing process for mass production. The thin film solar cell can be classified, according to material, such as an amorphous silicon, CdTe, and CIGS (CuInGaSe) thin film solar cell. The CIGS thin film solar cell with CIGS material using a light-absorbing layer has superior conversion efficiency 19.9% versus other materials. In addition, the CIGS thin film solar cell has advantages of, composition transformation, variable band gap and ability for transformation into p-n type semiconductors. Also CIGS thin film solar cells have the most optimum absorption coefficient amount direct band gap semiconductor materials. Moreover, the CIGS thin film solar cell is reliable as it does not have Staebler Wronski effect as do amorphous silicon materials and poisonous cadmium as do cadmium telluride materials. Therefore, CIGS materials are desired for use in thin film solar cell.

The CIGS light-absorbing layer of the thin film solar cells is usually formed by an electro-deposition, spray pyrolysis, sputtering, co-evaporation, etc. process. The impurity in the CIGS light-absorbing layer affects the conversion efficiency of the thin film solar cell. Thus, the Cu(In, Ga)Se2 material is usually formed at a high vacuum (10-4 torr~10-7 torr) to avoid external impurities and improve film quality. However, since the cost for vacuum manufacturing is higher than non-vacuum manufacturing, a non-vacuum manufacturing procedure is desired.

At present, powders used for the wet coating method is formed by conventional methods such as a solid state method, a hydrothermal/solvothermal method, a sol-gel method, a polyol reduction method, etc. For example, Bhattacharya et al. (U.S. Pat. No. 5,731,031) manufactures a crystal powder precursor for solar cells, such as $Cu_xSe_n$ (x=1-2, n=1-3), $Cu_xGa_ySe_n$ (x=1-2, y=0-1, n=1-3), $Cu_xIn_ySe_n$ (x=1-2.27, y=0.72-2, n=1-3), $Cu_x(InGa)_ySe_n$ (x=1-2.17, y=0.96-2, n=1-3) and $In_ySe_n$ (y=1-2.3, n=1-3), by the chemical bath method. However, at present, the powders used for the wet coating method are crystalline. Thus, it is difficult to precisely control the composition and particle size of the crystalline powers. Therefore, an improved method for easier control of the composition and particle size of the crystalline powers is desirable.

BRIEF SUMMARY OF THE INVENTION

An exemplary embodiment of a method for an IBIIIAVIA-group amorphous compound used for thin-film solar cells is provided. A mixture solution comprising elements of Group IB, IIIA, VIA or combinations thereof is provided. The mixture solution is heated and filtered. IBIIIAVIA-group amorphous powders are acquired after drying the heated and filtered mixture solution.

Yet another exemplary embodiment of the invention provides a method for fabricating an IBIIIAVIA-group amorphous precursor used for a thin-film solar cell. A mixture solution comprising elements of Group IB, IIIA, VIA or combinations thereof is provided. A solvent of the mixture solution comprises water. The mixture solution is heated, washed, and filtered. Nano-scale IBIIIAVIA-group amorphous powders used as precursors for an IBIIIAVIA-group chalcopyrite structure are acquired after drying the heated, washed and filtered mixture solution.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein:

FIGS. 6A and 6B are X-ray energy dispersive spectra (EDS) analyses of amorphous copper indium gallium selenite powders and CIGS chalcopyrite structure, respectively.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
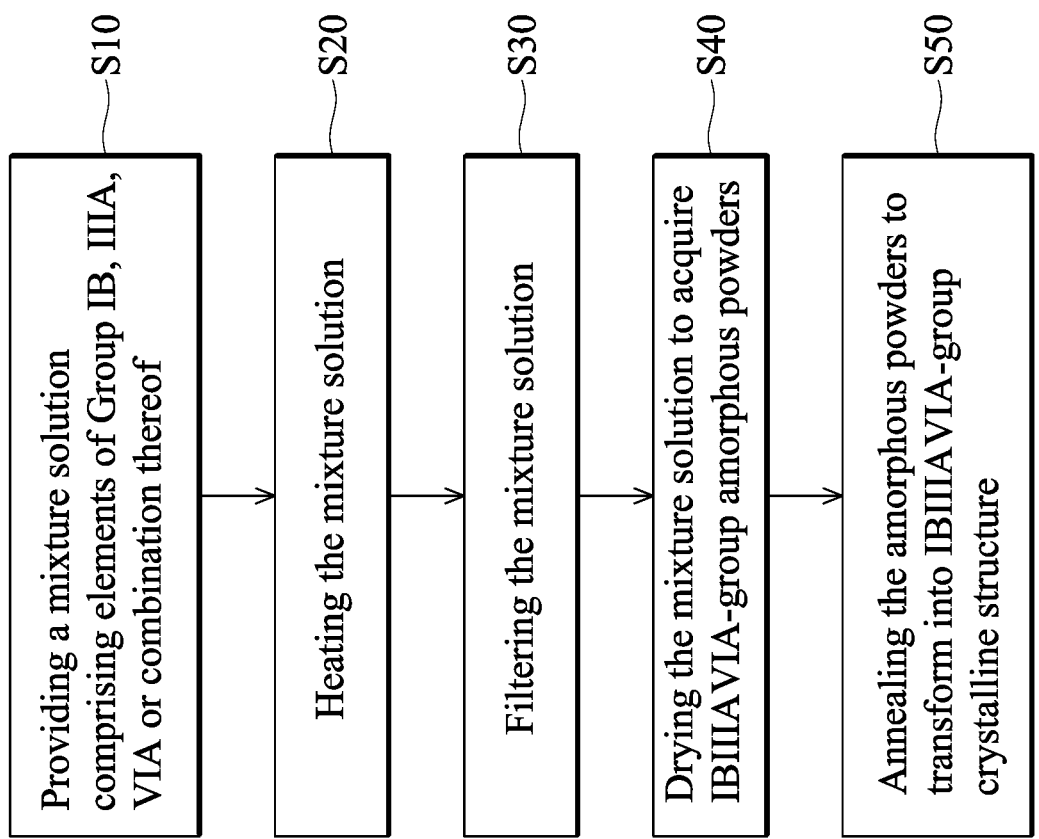
FIG. 1 is a flow chart illustration a synthesis method for an IBIIIAVIA-group amorphous compound according to an embodiment of the invention.

FIG. 1 is a flow chart illustration an embodiment of a synthesis method for IBIIIAVIA-group amorphous powders by a solvothermal method. First, a mixture solution comprising elements of Group IB, IIIA, VIA or combinations thereof is provided (step S10). A solvent of the mixture solution includes water, but does not include organic solvent. Embodiments of the invention use the water solvent instead of the organic solvent conventionally used, to avoid environmental pollution. Furthermore, since water is a relatively easy to get and cheap substance, manufacturing costs are reduced. The element of Group IB comprises Cu and Ag that may be from an ion compound of chloride, nitrate, or sulfate. The element of Group IIIA comprises Al, In, and Ga that may be from an ion compound of chloride, nitrate, or sulfate. The element of Group VIA comprises S, Se, and Te that may be from an ion compound of selenite, sulfite, or tellurite. For example, a weighted $CuCl_2 \cdot _2H_2O$ (or $CuCl_2$), $InCl_3$ and/or $GaCl_3$, and $Na_2SeO3$ are dissolved in water in a container. Next, a magnet is put into the mixture solution and uniformly agitated by a magnetic stirrer driver. After agitation, the container is tightly locked in a microwave reactor.

Next, the mixture solution is heated (step S20). The mixture solution may be heated by a direct heat source or preferably by a microwave heat source. The reaction time is shortened substantially when heating by a microwave heat source. The power of the microwave heat source is 1 W to 200 W, preferably 10 W to 100 W. The temperature of the microwave heat source is between 10° C. to 400° C., preferably between 100° C. to 300° C., more preferably between 130° C. to 190° C. The time of microwave heating is 1 second to 3 hours, preferably 1 minute to 1 hour.

After reaction, the mixture solution is filtered (step S30). For example, the mixture solution is put into a funnel for separation thereof or selectively washed by ethanol or water at the same time.

Next, the mixture solution is dried to acquire IBIIIAVIA-group amorphous powders (step S40). For example, the filtered mixture solution is put into a vacuum high temperature oven and dried. The drying temperature is set at between 30° C. to 150° C., preferably between 50° C. to 80° C. The drying time is between 1 hour and 100 hours, preferably between 3 hours and 8 hours. Following drying, the amorphous powders of the invention are acquired.

Next, the amorphous powders are annealed to transform into an IBIIIAVIA-group crystalline structure (step S50). For example, the synthesized uniform nano-powders are annealed to acquire a crystalline structure in a high temperature furnace at a temperature of between 30° C. to 1000° C., preferably between 300° C. to 600° C., with leading hydrogen and/or inert gas, for 1 minute to 1 day, preferably 10 minutes to 10 hours. In one embodiment, the amorphous powders covering a substrate are annealed to form a crystalline structure film. The crystalline structure is preferably a chalcopyrite structure. The IBIIIAVIA-group chalcopyrite structure may be used as a photoelectric conversion layer in a thin-film solar cell. The thin-film solar cell includes an IBIIIAVIA-group thin-film solar cell or polymer thin-film solar cell.

In the polymer thin-film solar cell, the nano-chalcopyrite structure may be mixed with a conductive polymer that may be selected from the group consisting of poly(3,4-ethylene-dioxythiophene) (PEDOT), polythiophene, polypyrrole, and polyaniline.

The following examples are intended to illustrate the invention more fully without limiting their scope, since numerous modifications and variations will be apparent to those skilled in this art.

EXAMPLE 1

$CuCl_2 \cdot 2H_2O$, $InCl_3$, and $Na_2SeO_3$ powders with molar ratio of Cu:In:Se=1:1:2 were weighted and dissolved in water and were positioned in a container. Next, a magnet was put into the mixture solution and uniformly agitated by a magnetic stirrer driver for about 10 minutes. After agitation, the container was tightly locked in a microwave reactor.

Next, the mixture solution was heated by a microwave generator with about 200 W at about 180° C. for about 30 minutes. After the reaction was completed, the mixture solution was put into a funnel for separation thereof and washed by ethanol or water at the same time, thus acquiring a glue mixture.

Next, the filtered production was put into a vacuum high temperature baking oven and dried at about 80° C. for about 1 hour, thus acquiring amorphous copper indium selenite ($CuIn(SeO_3)_2$) powders.

After the amorphous copper indium selenite powders were deposited on a substrate by an electrophoresis deposition method, the amorphous copper indium selenite powders were annealed in a high temperature furnace by introducing inert gas with a volume percent of 2% of hydrogen at about 500° C. for about 1 hour, thus acquiring a copper indium selenium (CIS) chalcopyrite structure.

Figure 2A:
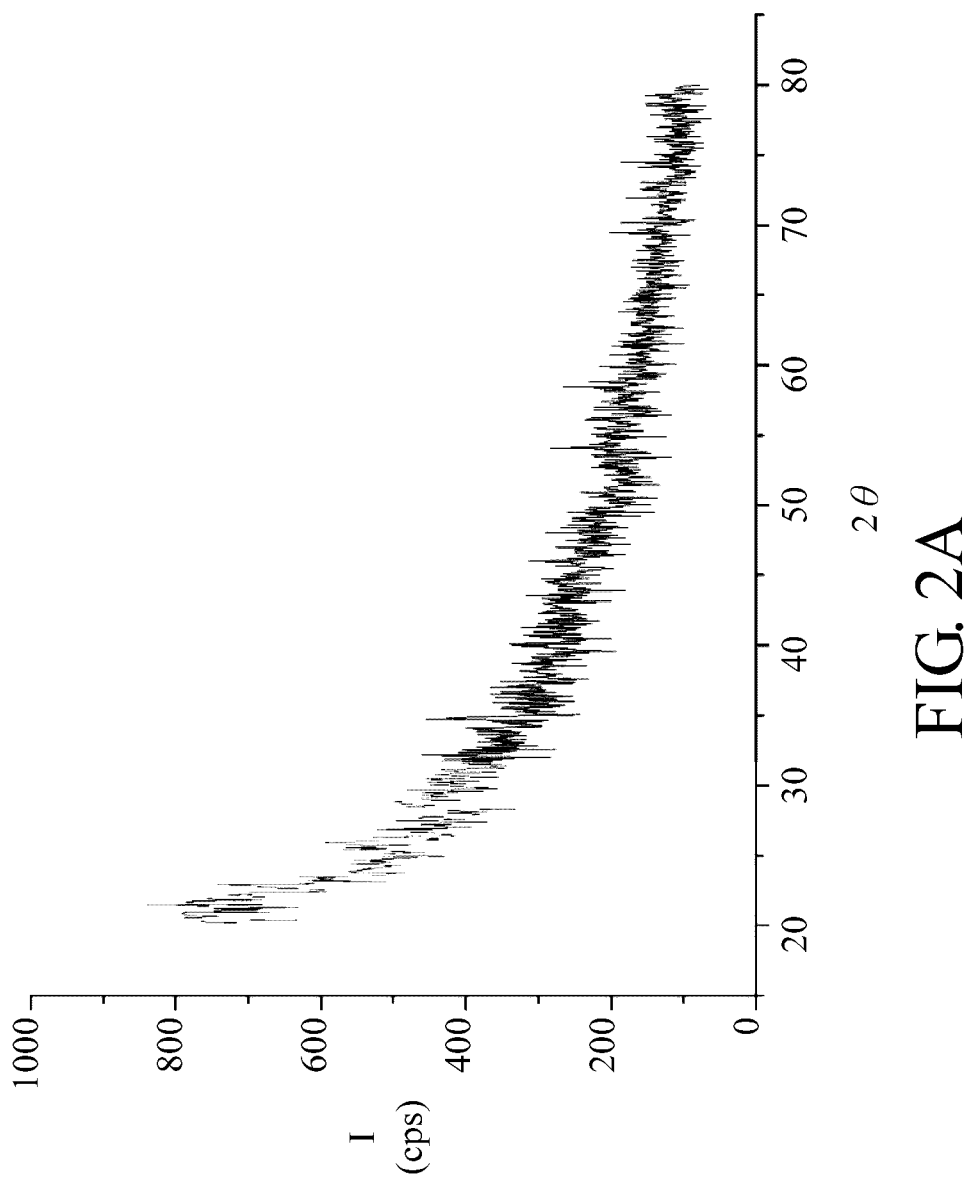
FIGS. 2A and 2B are X-ray diffraction spectrums of amorphous copper indium selenite powders and CIS chalcopyrile structure, respectively.
Figure 2B:
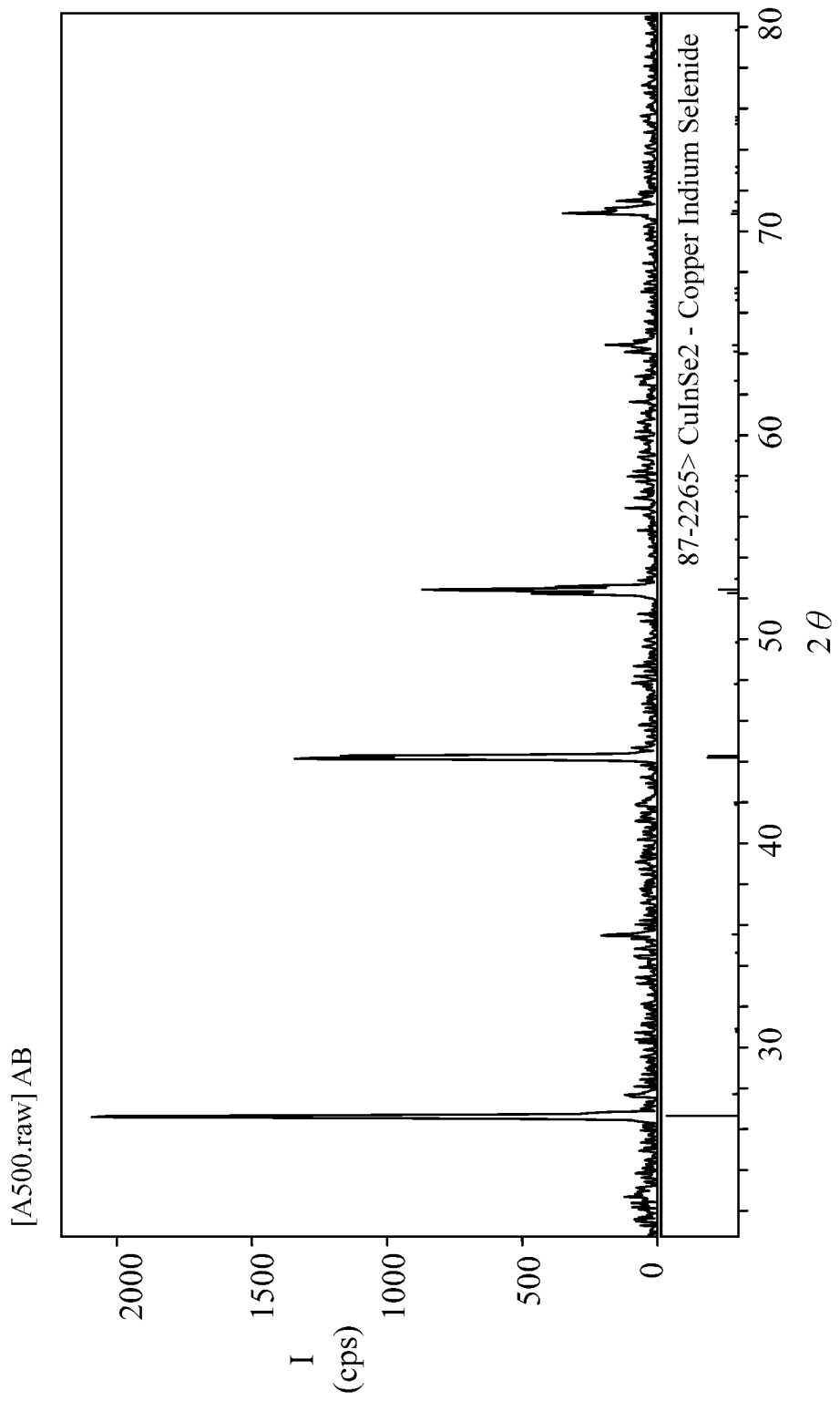
Figure 3A:
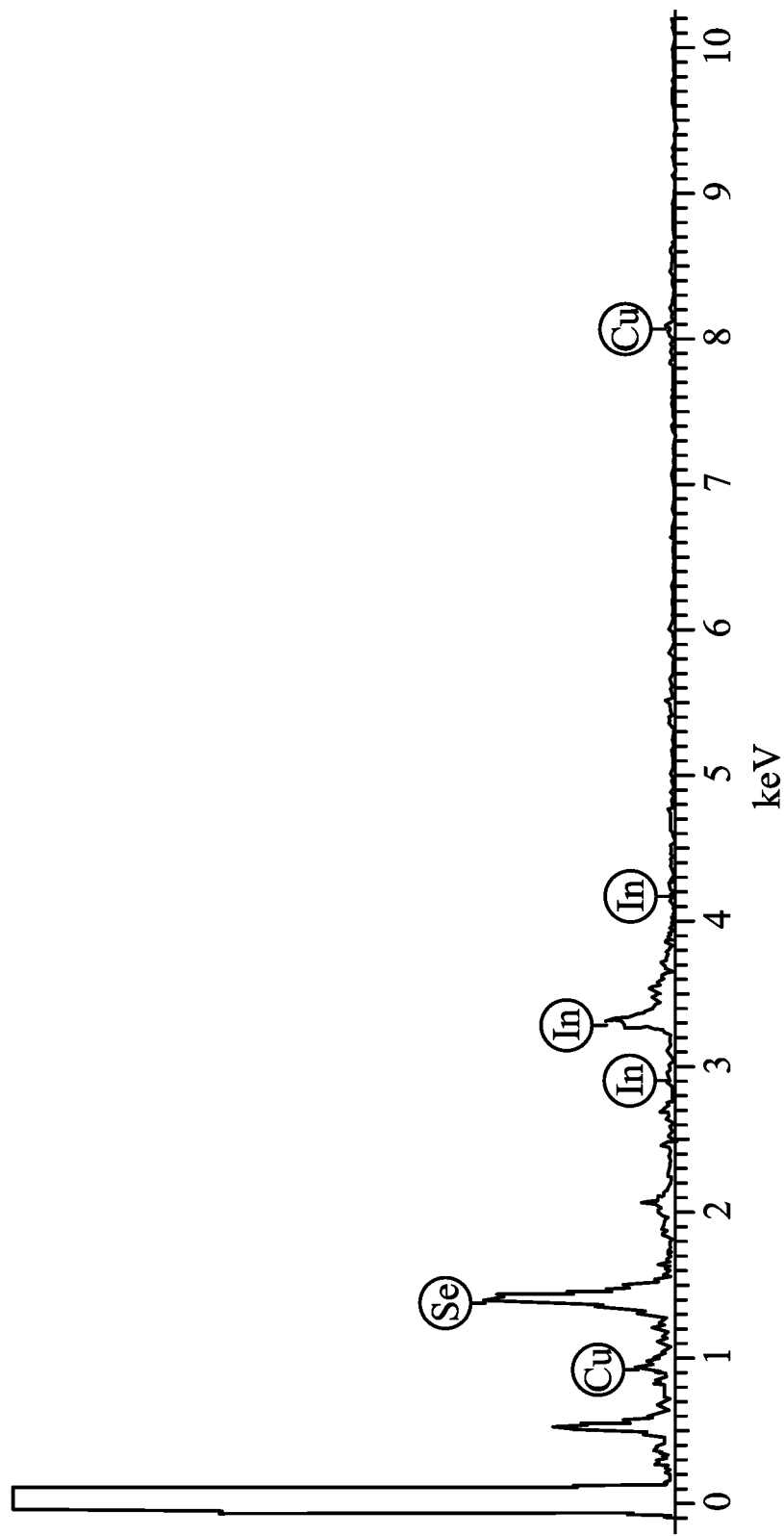
FIGS. 3A and 3B are X-ray energy dispersive spectra (EDS) analyses of amorphous copper indium selenite powders and CIS chalcopyrite structure, respectively.
Figure 3B:
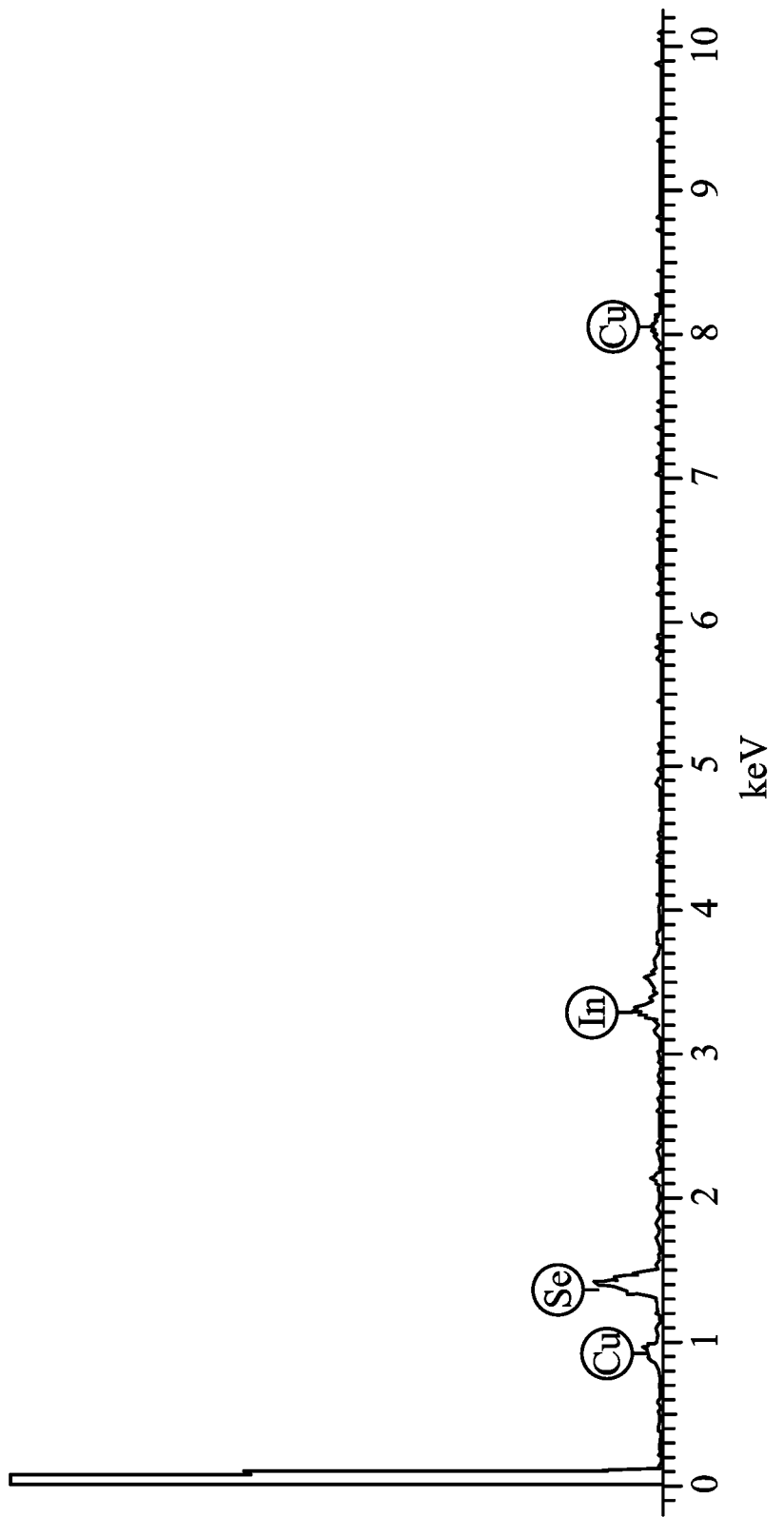
Figure 4A:
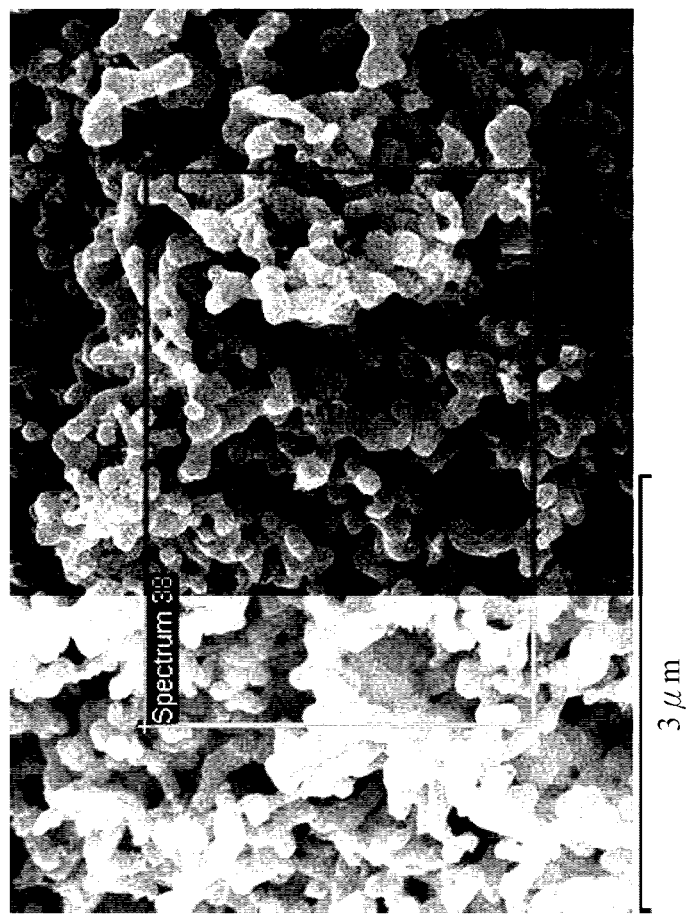
FIGS. 4A and 4B arc SEM pictures of amorphous copper indium selenite powders and CIS chalcopyrite structure, respectively.
Figure 4B:
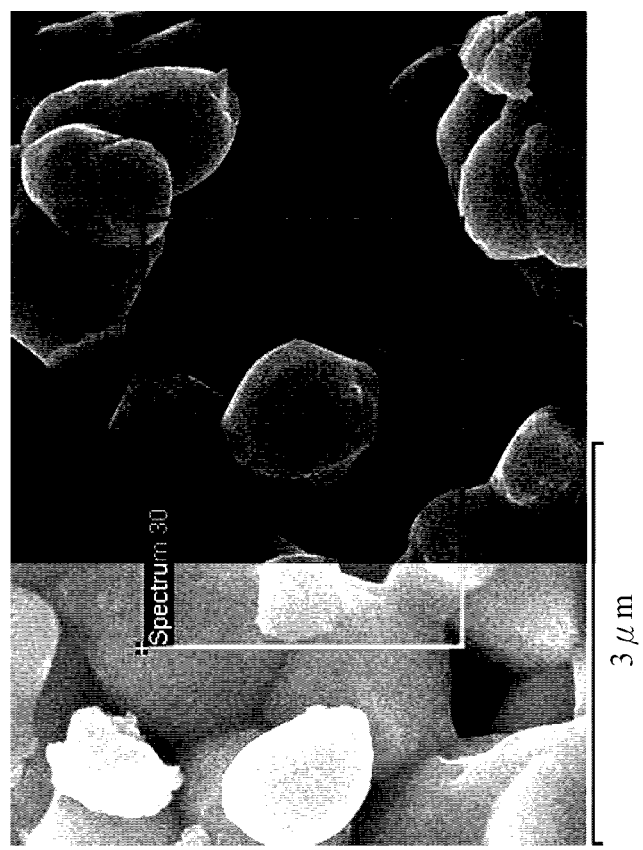

FIGS. 2A and 2B are X-ray diffraction spectrums of amorphous copper indium selenite powders and CIS chalcopyrite structure, respectively. FIGS. 3A and 3B are X-ray energy dispersive spectra (EDS) analyses of the amorphous copper indium selenite powders and CIS chalcopyrite structure, respectively. Tables 1 and 2 list each element content of the amorphous copper indium selenite powders and CIS chalcopyrite structure, respectively, according to the X-ray EDS analysis. FIGS. 4A and 4B are SEM pictures of the amorphous copper indium selenite powders and CIS chalcopyrite structure, respectively.

FIGS. 2A and 2B indicate that the CIS chalcopyrite structure was acquired after annealing the amorphous copper indium selenite powders. Referring to FIG. 2B, the result of the X-ray diffraction spectrum of the CIS chalcopyrite structure corresponds to the JCPDS card No. 87-2265 with main peaks (112), (220)/(204), (116)/(312) planes without other intermediate phases. Referring to FIGS. 3A and 3B, and Tables 1 and 2, each element ratio of the amorphous copper indium selenite powders before and after being annealed was analyzed by an EDX, resulting in a ratio of the Cu:In:Se=1:1:2, which matched theoretical expectations. Referring to FIG. 4A and 4B, the amorphous copper indium selenite powders and CIS chalcopyrite structure had uniform size distribution.

TABLE 1 element contents of amorphous copper indium selenite powders

| element | weight % | atom number % |
|---|---|---|
| Cu L | 17.88 | 23.62 |
| Se L | 49.33 | 52.42 |
| In L | 32.79 | 23.96 |
| Total | 100.00 | |

TABLE 2 element contents of CIS chalcopyrite structure

| element | weight % | atom number % |
|---|---|---|
| Cu L | 15.02 | 20.36 |
| Se L | 46.58 | 50.82 |
| In L | 38.41 | 28.82 |
| Total | 100.00 | |

EXAMPLE 2

The fabrication steps of this example are similar to that described in Example 1, wherein $CuCl_2 \cdot 2H_2O$, $InCl_3$, $GaCl_3$, and $Na_2SeO_3$ powders were weighted to have a molar ratio of about Cu:In:Ga:Se=1:0.7:0.3:2. In this example, amorphous copper indium gallium selenite ($CuInGa(SeO_3)_2$) powders were acquired. The CIGS chalcopyrite structure was acquired after annealing the amorphous copper indium gallium selenite powders.

Figure 5A:
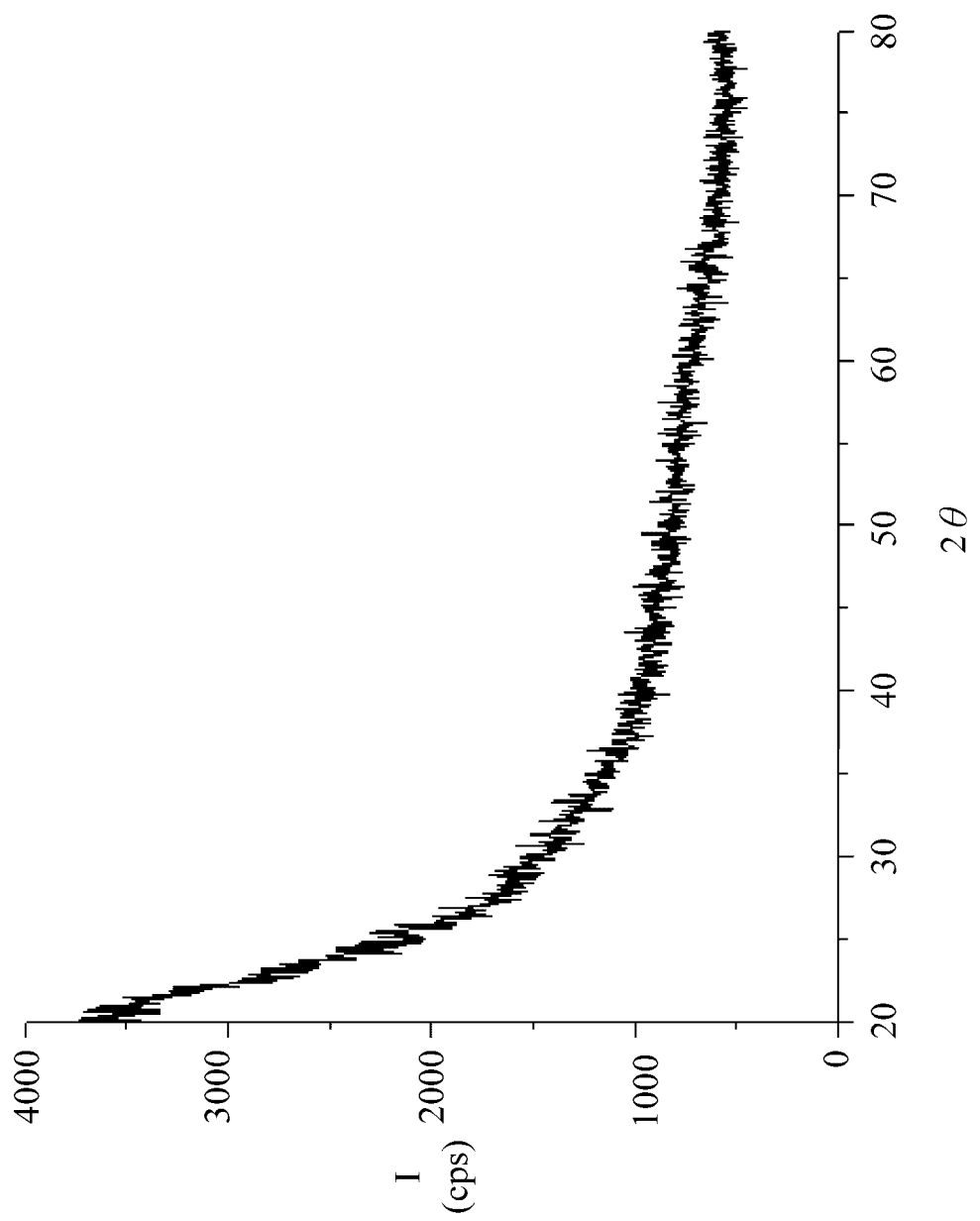
FIGS. 5A and 5B are X-ray diffraction spectrums of amorphous copper indium gallium selenite powders and CIGS chalcopyrite structure, respectively.
Figure 5B:
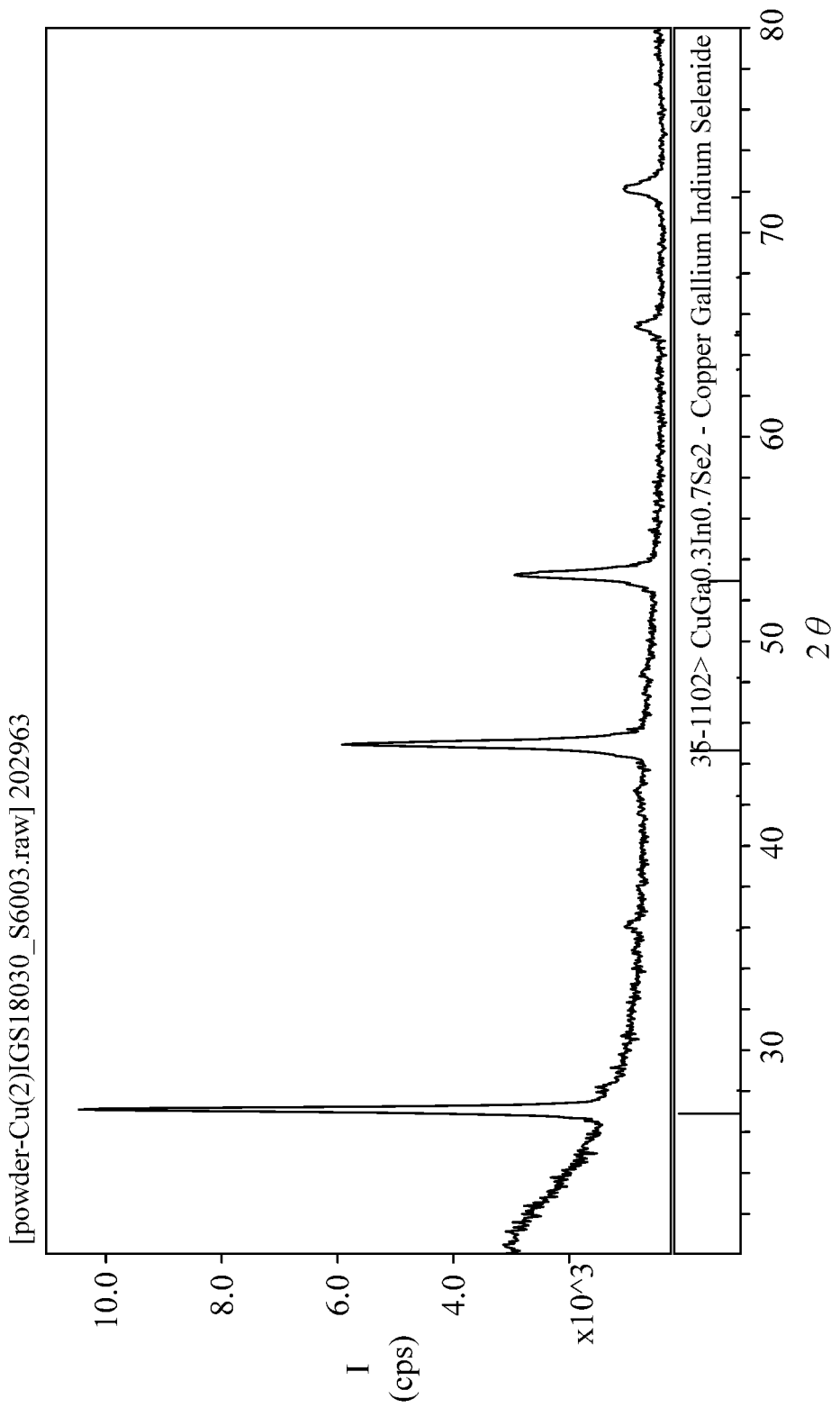
Figure 7A:
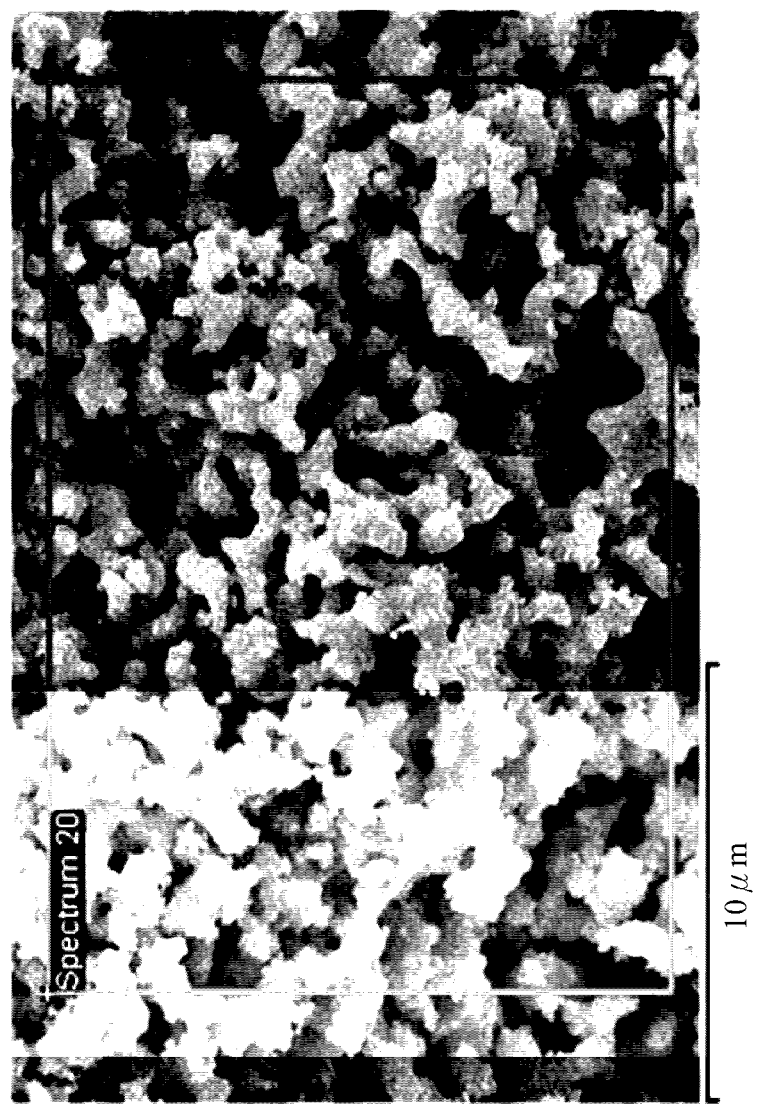
FIGS. 7A and 7B are SEM pictures of amorphous copper indium gallium selenite powders and CIGS chalcopyrite structure, respectively.
Figure 7B:
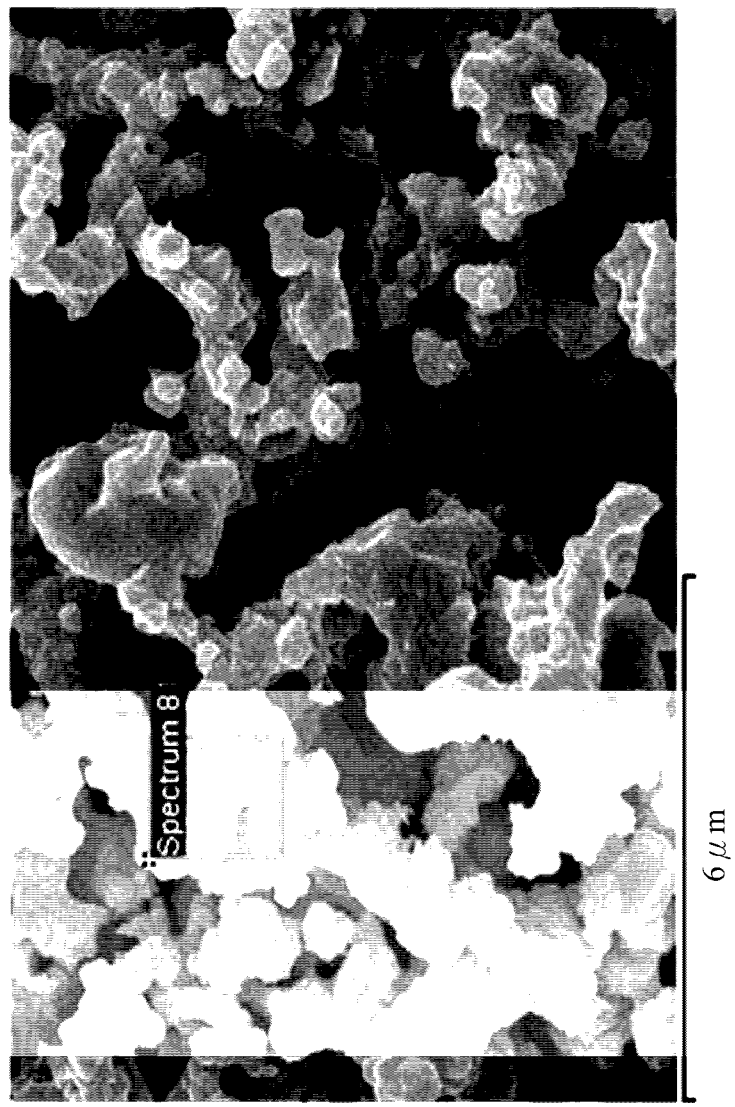

FIGS. 5A and 5B are X-ray diffraction spectrums of amorphous copper indium gallium selenite powders and CIGS chalcopyrite structure, respectively. FIGS. 6A and 6B are X-ray energy dispersive spectra (EDS) analyses of the amorphous copper indium gallium selenite powders and CIGS chalcopyrite structure, respectively. Tables 3 and 4 list each element content of the amorphous copper indium gallium selenite powders and CIGS chalcopyrite structure, respectively, according to the X-ray EDS analysis. FIGS. 7A and 7B are SEM pictures of the amorphous copper indium gallium selenite powders and CIGS chalcopyrite structure, respectively.

FIGS. 5A and 5B indicate that the CIGS chalcopyrite structure was acquired after annealing the amorphous copper indium gallium selenite powders. Referring to FIG. 5B, the result of the X-ray diffraction spectrum of the CIGS chalcopyrite structure corresponds to the JCPDS card No. 35-1102 with main peaks (112), (220), (312) planes without other intermediate phases. Referring to FIGS. 6A and 6B, and Tables 3 and 4, each element ratio of the amorphous copper indium gallium selenite powders before and after being annealed was analyzed by an EDX, resulting in a ratio of the Cu:In:Se:Ga=1:0.7:0.3:2, which matched theoretical expectations. Referring to FIGS. 7A and 7B, the amorphous copper indium gallium selenite powders and CIGS chalcopyrite structure had uniform size distribution.

TABLE 3 element contents of amorphous copper indium gallium selenite powders

| element | weight % | atom number % |
|---|---|---|
| Cu L | 18.09 | 23.58 |
| Ga L | 5.52 | 6.55 |
| Se L | 45.12 | 47.32 |
| In L | 31.27 | 22.55 |
| Total | 100.00 | |

TABLE 4 element contents of CIGS chalcopyrite structure

| element | weight % | atom number % |
|---|---|---|
| Cu L | 17.49 | 22.01 |
| Ga L | 8.51 | 9.76 |
| Se L | 52.81 | 53.47 |
| In L | 21.19 | 14.76 |
| Total | 100.00 | |

Some advantages of the embodiments of the invention are described in the following. The IBIIIAVIA-group amorphous powder precursors for solar cells are fabricated by a hydrothermal method with water solvent instead of organic solvent conventionally used, thus avoiding environmental pollution. The reaction time is shortened substantially due to heating by a microwave heat source. The size distribution uniformity of the acquired amorphous powders is excellent. The IBIIIA-VIA-group chalcopyrite structure, transformed from the IBIIIAVIA-group amorphous powders by annealing, is pure and has good size distribution uniformity. Therefore, the IBIIIAVIA-group amorphous powders are suitable to be used as slurry materials for a wet coating or electrophoresis process for fabricating corresponding thin-films. Due to the good uniform composition and size distribution of the amorphous powders, there is no crystalline orientation problem in the fabricated slurry and plating liquid. Therefore, the amorphous powders can be spread over a substrate uniformly without orientation. Furthermore, control of orientation and uniformity of the chalcopyrite structure thin-film when fabricating thin-film solar cells is improved.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating an IBIIIAVIA-group amorphous compound, comprising:
   providing a liquid mixture solution comprising precursors of elements of Group IB, IIIA and VIA in a solvent, wherein the solvent comprises water, and does not comprise organic solvent,
   wherein the precursor of elements of Group IB comprises chloride salt, nitrate salt, or sulfate salt of Cu or Ag,
   the precursor of elements of Group IIIA comprises chloride salt, nitrate salt, or sulfate salt of Al, In, or Ga, and
   the precursor of elements of Group VIA comprises selenite salt, sulfite salt or tellurite salt of S, Se, or Te;
   heating the liquid mixture solution;
   filtering the liquid mixture solution; and
   drying the liquid mixture solution to acquire IBIIIAVIA-group amorphous powders comprising $CuIn(SeO_3)_2$.

2. The fabrication method as claimed in claim 1, further comprising washing the mixture solution by using a washing agent including deionized water or ethanol before the drying step.

3. The fabrication method as claimed in claim 1, wherein the IBIIIAVIA-group amorphous powders are used for a thin-film solar cell.

4. The fabrication method as claimed in claim 3, wherein the thin-film solar cell comprises an IBIIIAVIA-group thin-film solar cell or polymer thin-film solar cell.

5. The fabrication method as claimed in claim 1, wherein the IBIIIAVIA-group amorphous powders are used as a precursor for an IBIIIAVIA-group crystalline structure.

6. The fabrication method as claimed in claim 5, wherein the IBIIIAVIA-group crystalline structure has a chalcopyrite structure.

7. The fabrication method as claimed in claim 5, wherein the IBIIIAVIA-group crystalline structure is mixed with a conductive polymer to be used for polymer thin-film solar cells.

8. The fabrication method as claimed in claim 7, wherein the conductive polymer is selected from the group consisting of poly(3,4-ethylenedioxythiophene) (PEDOT), polythiophene, polypyrrole, and polyaniline.

9. The fabrication method as claimed in claim 5, wherein the IBIIIAVIA-group amorphous powders are transformed into the IBIIIAVIA-group crystalline structure by annealing the IBIIIAVIA-group amorphous powder.

10. A method for fabricating an IBIIIAVIA-group amorphous precursor used for a thin-film solar cell comprising:
providing a mixture solution comprising precursors of elements of Group IB,
IIIA and VIA in a solvent, wherein the solvent comprises water, and
does not comprise organic solvent,
wherein the precursor of elements of Group IB comprises chloride salt, nitrate salt, or sulfate salt of Cu or Ag,
the precursor of elements of Group IIIA comprises chloride salt, nitrate salt, or sulfate salt of Al, In, or Ga, and
the precursor of elements of Group VIA comprises selenite salt, sulfite salt or tellurite salt of S, Se, or Te;
heating the mixture solution;
washing and filtering the mixture solution;
drying the mixture solution to acquire nano-scale IBIIIAVIA-group amorphous powders comprising CuIn$(SeO_3)_2$; and
annealing the nanoscale IBIIIAVIA-group amorphous powders to transform them into an IBIIIAVIA-group crystalline structure.

11. The fabrication method as claimed in claim 10, wherein the IBIIIAVIA-group chalcopyrite structure is used as a photoelectric conversion element of the thin-film solar cell.

12. The method as claimed in claim 10, wherein a washing agent comprising deionized water or ethanol is used in the step of washing.

13. The method as claimed in claim 10, wherein the IBIIIAVIA-group chalcopyrite structure for polymer thin-film solar cells is mixed with a conductive polymer.

14. The method as claimed in claim 13, wherein the conductive polymer is selected from the group consisting of poly(3,4-ethylenedioxythiophene) (PEDOT), polythiophene, polypyrrole, and polyaniline.

* * * * *